US006823486B2

(12) United States Patent
Ghosh

(10) Patent No.: US 6,823,486 B2
(45) Date of Patent: Nov. 23, 2004

(54) AUTOMATIC TEST PATTERN GENERATION FOR FUNCTIONAL REGISTER TRANSFER LEVEL CIRCUITS USING ASSIGNMENT DECISION DIAGRAMS

(75) Inventor: Indradeep Ghosh, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 568 days.

(21) Appl. No.: 09/851,708

(22) Filed: May 8, 2001

(65) Prior Publication Data

US 2002/0032889 A1 Mar. 14, 2002

Related U.S. Application Data

(60) Provisional application No. 60/209,340, filed on Jun. 5, 2000.

(51) Int. Cl.[7] .......................................... G01R 31/3183
(52) U.S. Cl. ................................................... 714/738
(58) Field of Search ................ 714/738; G01R 31/3183

(56) References Cited

U.S. PATENT DOCUMENTS

| | | | |
|---|---|---|---|
| 5,323,108 A | * 6/1994 | Marker et al. ............ 324/158.1 |
| 5,513,123 A | 4/1996 | Dey et al. .................... 364/489 |
| 5,602,856 A | 2/1997 | Teramoto ...................... 371/27 |
| 5,615,124 A | 3/1997 | Hemmi et al. ............... 364/488 |
| 5,625,630 A | 4/1997 | Abramovici et al. ........ 371/22.1 |
| 5,696,771 A | 12/1997 | Beausang et al. ........... 371/22.3 |
| 5,748,647 A | 5/1998 | Bhattacharya et al. |
| 5,875,196 A | 2/1999 | Chakradhar et al. ....... 371/22.1 |
| 5,883,809 A | 3/1999 | Sullivan et al. ............. 364/489 |
| 5,933,356 A | 8/1999 | Rostoker et al. ............ 364/489 |
| 5,991,523 A | 11/1999 | Williams et al. ....... 395/500.19 |
| 6,317,860 B1 | * 11/2001 | Heile ............................ 716/5 |

FOREIGN PATENT DOCUMENTS

| | | | |
|---|---|---|---|
| EP | 1162472 A2 * | 12/2001 | ....... G01R/31/3183 |
| JP | 2002049655 A * | 2/2002 | ........... G06F/17/50 |
| WO | WO 200120355 A1 * | 3/2001 | ........... G01R/31/28 |

OTHER PUBLICATIONS

Sandhya Seshadri and Michael S. Hsiao, "An Integrated Approach to Behavioral–Level Design–For–Testability Using Value–Range and Variable Testability Techniques", International Test Conference, 1999, pp. 858–867.

Albrecht P. Stroele, "Synthesis for Arithmetic Built–In Self–Test", 18th IEEE VLSI Test Symposium, Montreal, Canada, May 2000, pp. 165–170.

Albrecht P. Stroele, "Synthesizing Data Paths with Arithmetic Self–Test", IEEE International Symposium on Circuits and Systems (ISCAS), Geneva, Switerzerland, May 2000, pp. II–45–48.

Mark C. Hansen and John P. Hayes, "High–Level Test Generation using Physically–Induced Faults", VLSI Test Symposium Paper, May 1995, pp. 1–9.

Jaan Raik, "Hierarchical Test Generation Based on Alternative Graph Models", Computer Engineering adn Diagnostics Department of the Institute of Computer Engineering, Apr. 1997, pp. 1–44, Tallinn Technical University, Estonia.

(List continued on next page.)

Primary Examiner—R. Stephen Dildine
(74) Attorney, Agent, or Firm—Christie, Parker & Hale, LLP

(57) ABSTRACT

Test patterns are generated by generating assignment decision diagrams that represent a register transfer level digital circuit. A nine-valued symbolic algebra is used in which objectives are determined for portions identified in the assignment decision diagram. The objectives are justified and propagated by traversing the assignment decision diagram in which a test environment is found. Heuristics are used if a test environment is not initially found. Using the test environment found, predetermined test vectors are propagated to obtain a system-level test set. Each test set for each portion are concatenated to obtain a complete test set for the register transfer level digital circuit.

31 Claims, 10 Drawing Sheets

OTHER PUBLICATIONS

Indradeep Ghosh, Anand Raghunathan and Niraj K. Jha, "Design for Hierarchical Testability of RTL Circuits Obtained by Behavioral Synthesis", IEEE International Conference on Computer Design, 1995, pp. 1–27.

Indradeep Ghosh, Anand Raghunathan, and Niraj K. Jha, "A Design for Testability Technique for RTL Circuits Using Control/Data Flow Extraction", In Proc. IEEE International Conference on Computer–Aided Design, 1996.

Indradeep Ghosh, Anand Raghunathan, and Niraj K. Jha, "Hierarchical Test Generation and Design for Testability of ASPPs and ASIPs", ACM, Inc., DAC 97, Anaheim, California.

Silvia Chiusano, Fulvio Corno, Paolo Prinetto, RT–level TPG Exploiting High–Level Synthesis Information, $17^{th}$ IEEE VLSI Test Symposium, Apr. 1999.

Yiorgos Makris and Alex Orailoğlu, "Property–Based Testability Analysis for Hierarchical RTL Designs", In Proceedings of the IEEE International Conference on Electronics Circuits and Systems, pp. 1089–1092, 1999.

Indradeep Ghosh, Niraj K. Jha and Sudipta Bhawmik, "A BIST Scheme for RTL Circuits Based on Symbolic Testability Analysis", IEEE Transactions on Computer–Aided Design of Integrated Circuits and Systems, Jan. 2000.

Farzan Fallah, et al., "Simulation Vector Generatino from HDL Descriptions for Observability–Enhanced Statement Converage", $36^{th}$ Design Automation Conference, New Orleans, 6 pgs, (Jun. 1999).

Abhijit Ghosh, et al., "Sequential Test Generation and Synthesis for Testability at the Register–Transfer and Logic Levels", IEEE Transactions on Computer–Aided Design of Integrated Circuits and Systems, vol. 12, No. 5, pp 579–598 (May 1993).

Viraphol Chaiyakul, et al., "High–Level Transformations for Minimizing Syntactic Variances", $30^{th}$ ACM/IEEE Design Automation Conference, pp 413–418 (1993).

Fulvio Corno, et al., "Testability Analysis and ATPG on Behavorial RT–Level VHDL", IEEE, International Test Conference, Paper 30.4, pp 753–759 (1997).

Sujit Dey, et al., "Non–Scan Design–For–Testability of RT–Level Data Paths", ACM, 11 pages (1994).

Lamport, L., "The Temporal Logic of Actions", Revised Version of SRC Research Report 79 to appear in ACM Transactions on Programming Languages and Systems, (19 pages) Apr. 1994.

Ghosh, S., "Test Compaction at the Register Transfer or Behavior level", Project Report, ELE 466: Digital System Testing, Dept. of Electrical Engineering, Princeton University, Princeton, NJ (8 pgs), 1994.

K. Chakrabarty, R. Mukherjee and A. Exnicios, "Synthesis of Transparent Circuits for Hierarchical and System–on–a–Chip Test", Proc. IEEE International Conference on VLSI Design, pp. 431–436, Bangalore, India, Jan. 2001.

European Search Report dated Jan. 19, 2004 for European Application No. EP 01304884.1–2216, Search Report mailed Feb. 23, 2004 (4 pgs.).

Ghosh et al., "Automatic Test Pattern Generation for Functional RTL Circuits Using Assignment Decision Diagrams," Design Automation Conference, (IEEE CAT. No. 00CH37106), Proceedings 2000 of ACM/IEEE–CAS/EDAC Design Automation Conference, Los Angeles, California, Jun. 5–9, 2000 (p 43–48).

Jervan et al., "High–Level Test Synthesis With Hierarchical Test Generation," Proceedings '99 17th Norchip Conference, Oslo, Norway, Nov. 8–9, 1999 (p 291–296).

Ubar et al., "Efficient Hierarchical Approach to Test Generation for Digital Systems," Tallin Technical University Conference Proceeding, Mar. 20, 2000 (p 189–195).

Vandeventer et al., "Using Binary Decision Diagrams to Speed Up the Test Pattern Generation of Behavioral Circuit Descriptions Written in Hardware Description Languages," Circuits and Systems, 1994 IEEE International Symposium On London, UK, May 30–Jun. 2, 1994 (p 279–282).

* cited by examiner

```
entity T1 is
      port (    RESET, CLK :IN std_logic;
                APORT, BPORT, CPORT, DPORT : IN std_logic_vector (7 downto 0);
                E : IN std_logic;
                OPORT : OUT std_logic_vector (7 downto 0) );
      end T1;
architecture RTL of T1 is
      type STATE_TYPE is ( S0, S1, S2, S3);
      signal CURRENT_STATE, NEXT_STATE : STATE_TYPE;
      SIGNAL A, B, C, D, F, G, O, NEXT_A, NEXT_B, NEXT_C, NEXT_D,
               NEXT_F, NEXT_G, NEXT_O : std_logic_vector (7 downto 0);
      begin
      COMBIN : process (CURRENT_STATE)
            begin
                  NEXT_A <= A; NEXT_B <= B; NEXT_C <= C; NEXT_D <= D;
                  NEXT_F <= F; NEXT_G <= G; NEXT_O <= O; OPORT <= O;
                  case CURRENT_STATE is
                        when S0 =>
                              NEXT_A <= APORT; NEXT_B <= BPORT;
                              NEXT_C <= CPORT; NEXT_D <= D;
                              NEXT_G <= "00000000";
                        when S1 =>
                              if ( C < D ) then                              ──── 301
                                    NEXT_F <= A + B;
                                    NEXT_STATE <= S2;
                              else
                                    NEXT_F <= A - B;
                                    NEXT_STATE <= S3;
                              end if;
                        when S2 =>
                              NEXT_G <= F + G;
                              if ( E = '0' ) then
                                    NEXT_STATE <= S1;
                              else
                                    NEXT_STATE <= S3;
                              end if;
                        when S3 =>
                              NEXT_O <= G - 3;
                              NEXT_STATE <= S0;
                  end case;
            end process;
      SYNCH : process (CLK, RESET)
            begin
                  if ( CLK'event and CLK = '1' ) then
                        if ( RESET = '1' ) then
                              CURRENT_STATE <= S0;
                        else
                              A <= NEXT_A; B <= NEXT_B; C <= NEXT_C; D <= NEXT_D;
                              G <= NEXT_G; F <= NEXT_F; O <= NEXT_O;
                        end if;
                  end if;
            end process;
end RTL;
```

AUTOMATIC TEST PATTERN GENERATION FOR FUNCTIONAL REGISTER TRANSFER LEVEL CIRCUITS USING ASSIGNMENT DECISION DIAGRAMS

CROSS-REFERENCE TO RELATED APPLICATIONS

This application claims the benefit of U.S. Provisional Application No. 60/209,340 filed Jun. 5, 2000, which is hereby incorporated by reference as if set forth in full herein.

BACKGROUND

The present invention relates to generating test patterns for digital circuits and in particular to generating test patterns for functional registered transfer level circuits by using an assignment decision diagram and a nine symbol algebra.

Test pattern generation for digital circuits which are sequential in nature is often difficult. Typically a large amount of computing time and resources are required to generate test patterns that target detection of stuck-at faults at the logic level, even for a moderately sized digital circuit. Design for testability (DFT) techniques have been proposed that reduce the complexity of the digital circuit by altering the circuit. However, although testability of the circuit increases, area overhead penalties, performance penalties, power overhead penalties or a combination thereof are often encountered. Hence, using DFT techniques is not always an option for easier generation of test patterns.

Furthermore, conventional test pattern generators often target the digital circuit at its logic level. At this level, it may be impossible to generate test patterns for large sequential circuits that provide adequate stuck-at fault coverage. Even if test patterns are generated with great difficulty, problems discovered at this level do not make the design process easier or reduce design turnaround time.

At the register transfer level (RTL), the problem size is reduced as the number of primitive elements in the digital circuit at this level is less than at the logic level. As a result, the test generation problem is simplified. Also, since the design process often starts at this level, discovery of errors can be easily fixed rather than at the logic level.

SUMMARY OF THE INVENTION

The present invention provides a test pattern generation system and method for register transfer level circuits.

In accordance with one aspect of the invention, test patterns are generated by generating an assignment decision diagram of the register transfer level digital circuit. From the assignment decision diagram, modules are identified and objectives are determined by using a nine-valued symbolic algebra. The objectives are justified and propagated by traversing the assignment decision diagram to obtain a test environment. Predetermined test vectors are propagated through the register transfer level digital circuit using the test environment obtained. In one aspect of the invention, the assignment decision diagram comprises a graph-like structure representing functional behavior of the register transfer level digital circuit and an approximate structural representation of the register transfer level digital circuit. In further aspects of the invention, pre-computed test vectors for one of the modules identified are applied to the test environment to obtain a system-level test set for the module identified and system-level test sets for each of the modules identified are concatenated to obtain a complete test set for the register transfer level digital circuit.

In another aspect of the invention, test patterns are generated by receiving a functional register transfer level circuit design of the digital circuit having a single clock line. A data structure from the circuit design received is generated and logic structures and blocks from the data structure are identified. Test objectives are justified from the inputs of the logic structures and blocks from primary inputs of the register transfer level digital circuit to identify justification paths. Test objectives are propagated from outputs of the logic structures and blocks to primary outputs of the register transfer level digital circuit to identify propagation paths. Predetermined test vectors are propagated through the digital circuit using the justification and propagation paths identified. In further aspects of the invention, pre-computed test vectors for one of the logic structures and blocks identified are applied to the justification and propagation paths to obtain a system-level test set for one of the logic structures and blocks identified and the system-level test sets for each of the logic structures and blocks identified are concatenated to obtain a complete test set for the register transfer level digital circuit.

Many of the attendant features of this invention will be more readily appreciated as the same becomes better understood by reference to the following detailed description considered in connection with the accompanying drawings.

BRIEF DESCRIPTION OF THE DRAWINGS

FIG. 3 illustrates one embodiment of a functional RTL circuit represented by a hardware description language;

DETAILED DESCRIPTION

Figure 1:
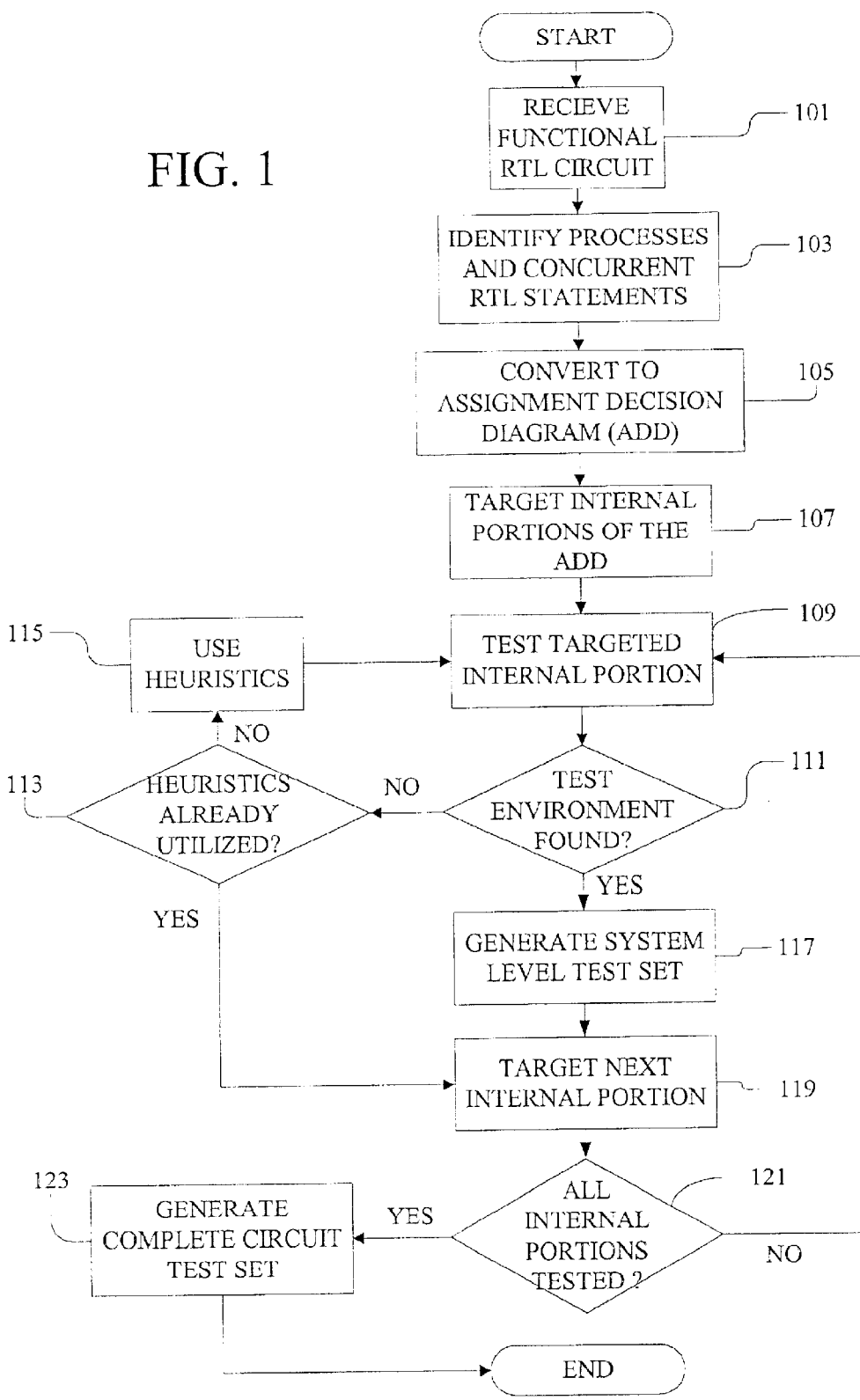
FIG. 1 illustrates a flow diagram of one embodiment of the test pattern generation process of the present invention.

FIG. 1 illustrates a flow diagram of one embodiment of a test pattern generation process of the present invention. In block 101, the process receives a functional RTL circuit description. In block 103, the process identifies each process and the concurrent RTL statements in each leaf component of the RTL circuit. In block 105, the process converts the RTL statements identified into assignment decision diagrams (ADDs). Internal portions or modules of one of the ADDs are targeted in block 107, e.g., arithmetic modules. In block 109, each targeted internal portion is tested. The internal portions of the ADD are tested using nine valued symbolic RTL justification and propagation. The RTL justification and propagation traces paths from the primary inputs of the circuit to the inputs of the internal portion and paths from the outputs from the internal portion to the primary outputs. The nine valued symbolic algebra used in justification and propagation is discussed in greater detail later.

In one embodiment, the justification and propagation is a branch and bound-type search with backtracking utilized with adjustable backtrack and search time limits. If the process receives a hierarchical RTL circuit description in block 101, then a hierarchy search traversal is utilized. Any transformations across operations are based on the nine valued algebra and stored in a look-up table. In block 111, the process determines if the testing of the internal portions result in a test environment. If in block 111, the process determines that a test environment has not been located, then in block 113 the process determines if heuristics have been previously utilized. If the process determines that heuristics have not been utilized, then the process utilizes heuristics in block 115. Utilizing heuristics increases test coverage of the internal portion. Thus, the process returns to block 109 to continue testing the internal portions of the ADD utilizing the heuristics provided in block 115.

If the process, in block 113, determines that heuristics have been used and no test environment has been found, in block 111, then the process determines that a test environment cannot be determined for the targeted internal portion. Thus, the process continues to block 119 to target the next internal portion.

If, in block 111, the process determines that a testing environment has been determined, a system level test set for the internal portions is generated in block 117. In block 119, the next internal portion of the ADD, e.g., other arithmetic modules, is targeted. The process also continues to test the other internal portions of the ADD and all the ADDs (logic arrays, storage units, interconnects, random logic blocks, and black boxes) until the process determines in block 121 that all the internal portions of the ADDs have been tested. In block 123, the system level test sets generated for all the internal portions tested (in block 115) are concatenated to generate a complete RTL circuit test set and the process ends.

Figure 2:
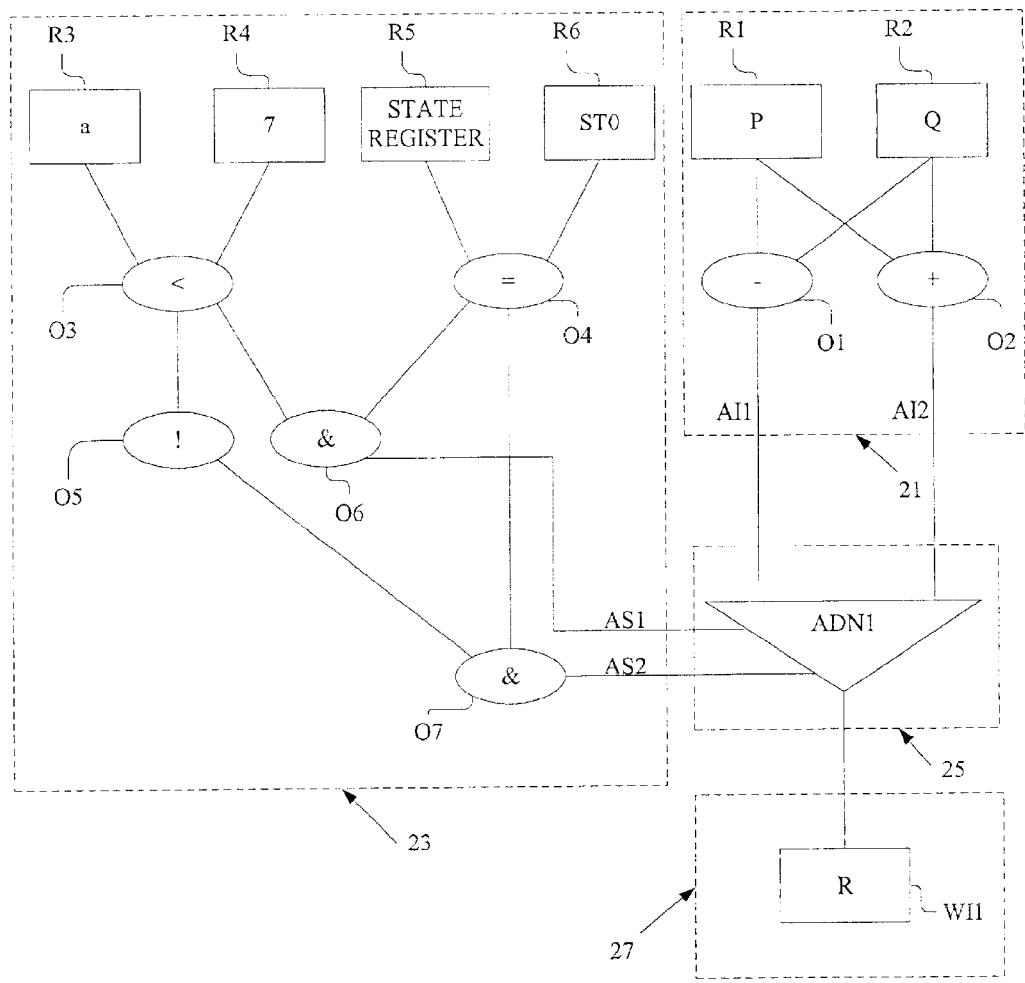
FIG. 2 illustrates one embodiment of an assignment decision diagram used by the test pattern generation process of the present invention.

Referring to block 105 in which the process converts the RTL statements into an ADD, FIG. 2 illustrates one such assignment decision diagram. A digital circuit includes primary inputs, primary outputs and internal storage elements. As such, the digital system is a set of computations on the values presented at the primary inputs with the results of the computations being stored in the internal storage elements or conveyed to the primary outputs. Thus, an assignment decision diagram represents a digital circuit as a set of conditional assignments to one or more targets in which the targets represent storage elements or output ports of a digital system.

The assignment decision diagram is a uni-directed acyclic graph. The assignment decision diagram includes four sections, an assignment value section 21, an assignment condition 23, an assignment decision 25 and an assignment target 27. Each section includes one or more nodes, read nodes, write nodes, operation nodes or assignment decision nodes. Each node has different attributes and are connected to other nodes. Connections between nodes are represented as uni-directed edges.

The assignment value section 21 represents a computation of values that are ultimately assigned to a storage element or an output port. Each value is computed from the current contents of the input ports, storage elements or constants and is represented as a read node, i.e., read nodes R1 and R2. The computation is represented as a data-flow graph having operation nodes O1 and O2 that are, for example, logical or arithmetic in nature.

The assignment condition section 23 includes read nodes R3–R6 connected to operation nodes O3–O7. Read node R5 represents a state register that represents a storage unit acting as a control step sequencer for a multi-state design. In other words, the state register includes a series of control instructions or assignment values that are sequenced by an assignment condition. The end products of the computation AS1 and AS2 are Boolean values and represent assignment condition selections. As such, the end products or assignment selections AS1 and AS2 act as guarding conditions for the assignment value section 21.

The assignment decision section 25 includes an assignment decision node AD1 that selects a value from a set of values that are provided at the inputs of the assignment decision section. The inputs are provided from the assignment value section and selection inputs are provided from the assignment condition section. Thus, if assignment selection AS1 is true, assignment input AI1 is selected. If assignment selection AS2 is true, assignment input AI2 is selected. If selection input AS1 and selection input AS2 are not true, neither input AI1 or AI2 is selected. Since only one of the inputs AI1 or AI2 is selectable at a time, the selection input AS1 and AS2 do not evaluate to true at the same time.

The assignment target section 27 includes write nodes. In the embodiment described, the assignment target section includes write node WI1. The write node receives a value from the assignment decision section, i.e., the selected value from the assignment decision node AD1. Also, since, at a given time, only one of the assignment inputs to the assignment decision node only evaluates to true, only one value is assigned to the assignment target at a time. Thus, all assignment conditions for an assignment target are mutually exclusive.

In one embodiment, storage units with multiple write ports (not shown) are represented by multiple assignment decision nodes with each assignment decision node representing assignments to one of the multiple write ports. As such, an assignment value is written to a write port via the assignment decision node only if the corresponding assignment condition evaluates to true. Storage units with multiple read/write ports (not shown) are represented by a two-dimensional array with an index assigned to each read/write port. The index identifies a location from which an assignment value is read from or written to. Storage units with multiple read ports are represented as read nodes with multiple output lines, such as read nodes R1 and R2.

In one embodiment, the size of the assignment decision diagram is proportional to the number of conditional assignments to all the ports and storage units. The assignment decision diagram represents conditions and computations in a consistent and seamless data-flow fashion. As such, the assignment decision diagram resembles a final structural netlist without relying on any specific synthesis decisions which facilitates locating stuck-at faults. Also, with control and data being integrated, as represented by the assignment decision diagram, control and data path separation problems are avoided during testing.

Figure 4:
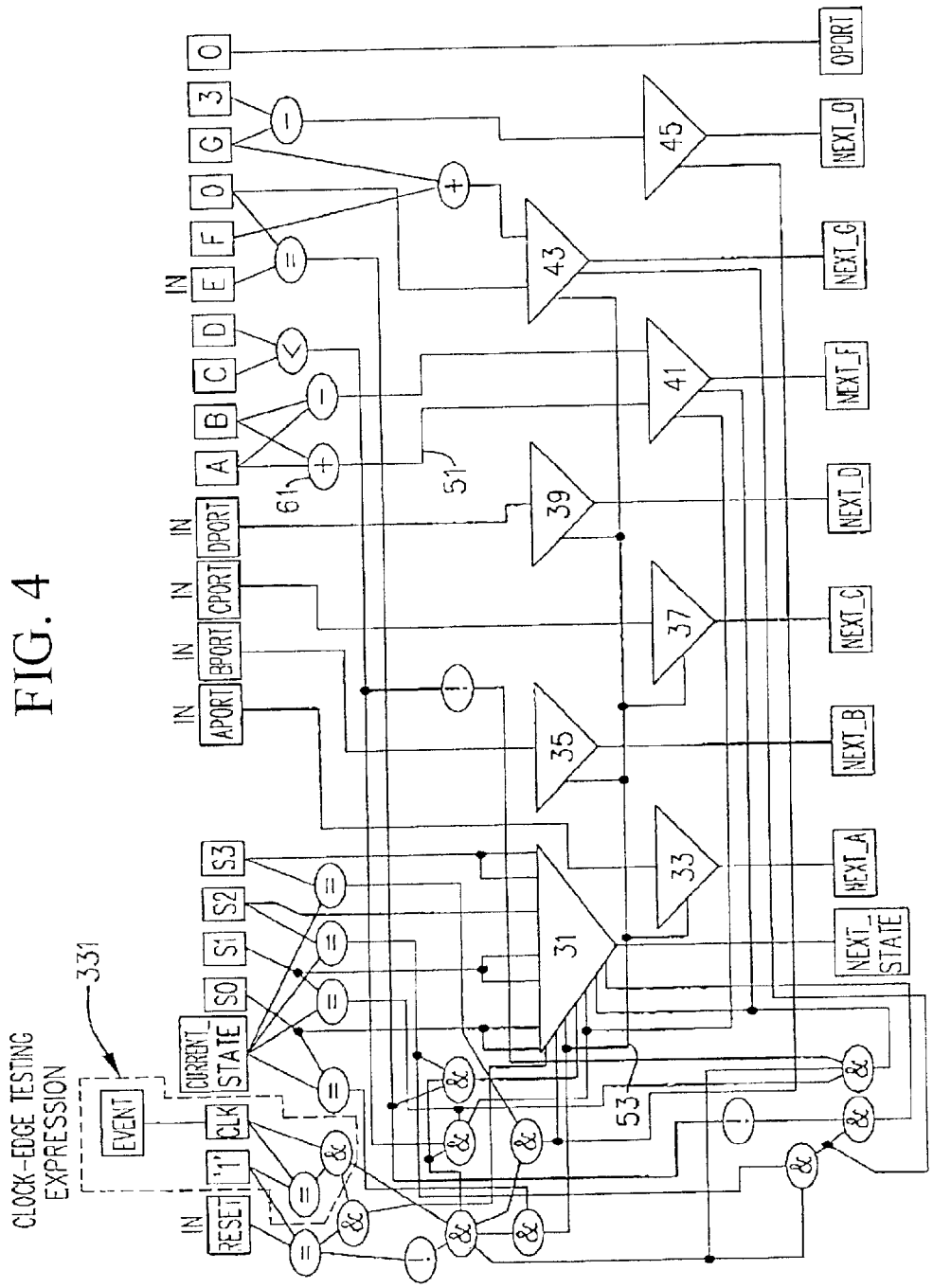
FIG. 4 illustrates one embodiment of an assignment decision diagram of the RTL circuit represented in FIG. 3.

Referring back to FIG. 1 and in particular to block 101, the process receives a RTL circuit description. FIG. 3 illustrates a functional RTL circuit represented as a hardware description language. From a hardware description language, such as WHDL or Verilog, each process is converted to an assignment decision diagram. For a combinational process and a sequential process of a finite state machine (FSM), the two processes are combined into one assignment decision diagram. FIG. 4 illustrates the assignment decision diagram of the RTL circuit description of FIG. 3. For example, the RTL statement 301 (FIG. 3) is represented by the read nodes A, B, operation node 61, assignment decision node 41 and write node NEXT_F. Reset, APORT, BPORT, CPORT, DPORT, E and Reset represent primary inputs and Oport represents a primary output. NEXT_A, NEXT_B, NEXT_C, NEXT_D, NEXT_F, NEXT_G, NEXT_O and NEXT_STATE are assignment targets. Current_state represents a state register, a storage unit.

A, B, C, D, E, F, 0, G, 3 and O are assignment values represented as read nodes. Additionally, APORT, BPORT, CPORT, DPORT, S0, S1, S2 and S3 are assignment values represented as read nodes. Various operation nodes are coupled to some of the read nodes and represent computation, e.g., A+B, A−B, etc. These read nodes and operation nodes are the assignment value section of the assignment decision diagram. The assignment value section is coupled to an assignment decision section that includes assignment decision nodes 31, 33, 35, 37, 39, 41, 43 and 45. The assignment condition section providing the selection input to the assignment decision section includes read nodes S0, S1, S2, S3 and RESET and various operation nodes coupled to the read nodes.

Figure 5:
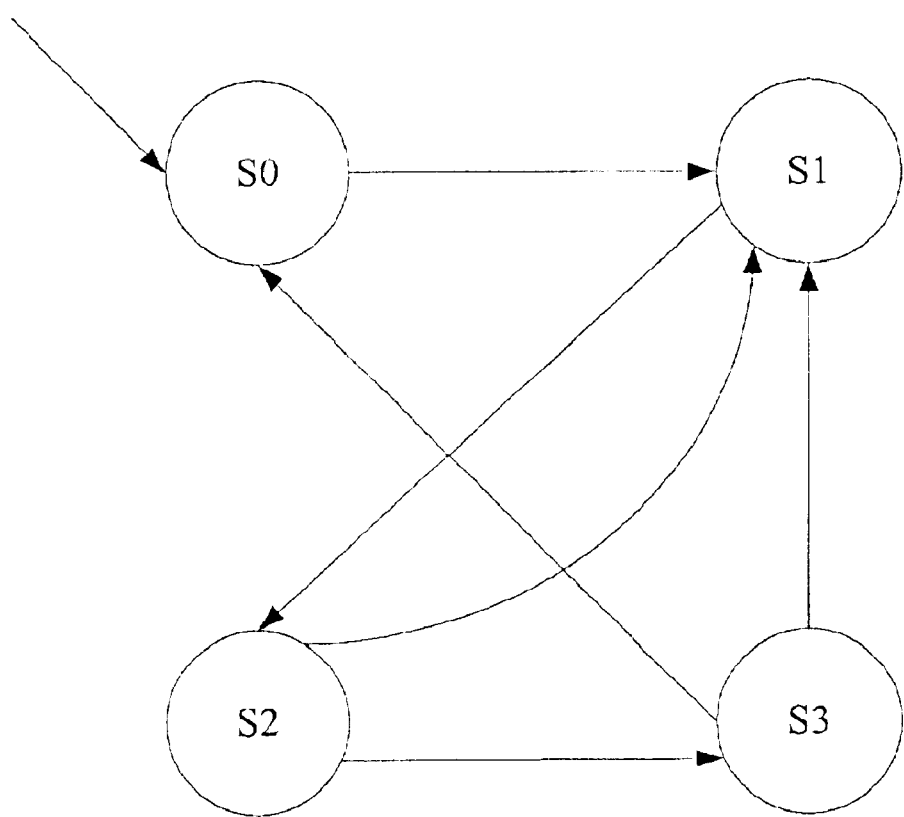
FIG. 5 illustrates a state transition diagram for the RTL circuit represented in FIG. 3.

A state transition graph is also generated for state variables, e.g., Current_state, as shown in FIG. 5. The states which are reached by setting or resetting input lines are reset states. The states where data is read from RTL variables which are inputs to the process where the FSM exists are input states. In FIG. 5, the reset state is state S0 and the input state is state S0. The output state is state S3. Output states are states where the results of computations within the FSM are written into RTL variables which are outputs to the process where the FSM exists.

Referring again to FIG. 1 and in particular block 109, in one embodiment, a nine symbol algebra is utilized to perform symbolic justification and propagation of the RTL circuit. The nine symbols include general controllability, Cg, controllability to zero, C0, controllability to one, C1, controllability to all ones, Ca1, controllability to a constant, Cq, controllability to a z value, Cz, controllability to a state, Cs, observability, O, and compliment of observability, O'. Similar symbolic algebra has been used for built-in self-test schemes on structural digital circuit designs. One such scheme is described in "A BIST Scheme for RTL Circuits Based on Symbolic Testability Analysis" by Ghosh et al., the disclosure of which is hereby incorporated by reference.

The general controllability symbol of an RTL variable represents the ability of the symbol to control its value to an arbitrary value. For example, if a general controllability symbol determined on a particular RTL variable having a byte width "n", then the RTL variable is controllable to any $2^n$ values possible on that RTL variable from the primary inputs of the RTL circuit.

The controllability to zero symbol of a RTL variable represents the ability to control the RTL variable to the value of zero. The controllability to one symbol of a RTL variable represents the ability to control the RTL variable to the value of one. The controllability to all ones symbol of a RTL variable represents the ability to control the RTL variable to the value of all ones. For example, all bits have a value of one for a multi-byte variable. In contrast, for the controllability to one symbol only a single bit has a value of one for the multi-byte variable. However, the controllability to all ones symbol is identical to the controllability to one symbol for a single bit RTL variable. For a 2's complement arithmetic, controllability to all ones corresponds to controllability to a minus one value.

The controllability to a constant symbol of a RTL variable represents the ability to control the RTL variable to a fixed constant value. For example, for an "n" byte RTL variable, the controllability to a constant symbol represents the ability to control the RTL variable to a single constant value out of $2^n$ possible values. For a single bit variable, the controllability to a constant symbol represents the ability to control the RTL variable to either a zero or one. The controllability to a z value symbol of a RTL variable represents the ability to control the RTL variable to a high impedance z state. The controllability to a state symbol of a state variable defined in a finite state machine represents the ability to control the state variable to a particular state. The observability symbol of a RTL variable represents the ability to observe a fault at a RTL variable. For example, in a multi-byte RTL variable, the observability symbol signifies that a faulty value is present on the RTL variable that differs from the correct or expected value. The compliment observability symbol is applicable for only single bit RTL variables and signifies a zero/one fault, i.e., the expected value on the RTL variable is a zero and the faulty value is a one.

The general controllability symbol on a RTL variable also represents the controllability to zero, controllability to one, controllability to all ones, and the controllability to a constant symbols for the same RTL variable. Likewise, either the controllability to zero, controllability to one, or the controllability to all ones symbols similarly represents the controllability to a constant symbol for the same RTL variable.

Using the nine symbols, transformation rules for justification and propagations are formulated. For example, general controllability at the output of an addition operation can be transformed to a general controllability symbol at one input of the addition operation and a controllability to a constant symbol at the other input to the addition operation. Similarly, an observability symbol at an input of a multiplication operation can be transformed to an observability symbol at the output of the multiplication operation and either a controllability to one or a controllability to all ones symbol at the other input of the multiplication operation. In one embodiment, transformation rules are stored in look-up table.

Since digital circuits often contain buses that split or join, bit indices are added to the RTL variable. Also, since the digital circuit may be sequential in nature, time frames are introduced to the nine symbol algebra. Thus, using the nine symbol algebra, an RTL justification/propagation record is defined as a six valued set including an ATPG objective, variable name, upper bit index and lower bit index of the variable, time frame value and a state value. For example, Cg(a[7:0], 0, −) represents that the objective of general controllability on the RTL variable a[7:0] in time frame 0 must be meet. Likewise, Cs(Current_state, 3, S0) represents that the objective of controllability of the state variable, Current_state to state S0 in time frame 3 must be meet.

As such, using the nine symbol algebra, justification and propagation paths of the RTL circuit can be described. For instance, the process targets an internal portion of the assignment decision diagram, i.e., in arithmetic module, such as the operation node 63, i.e., the addition operation in state S1. Control of the two inputs, read nodes A and B, of the addition operation, operation node 63, is required. Also, observation of the write node NEXT_F and traversal of the finite state machine is required in order to meet the justification and propagation objectives. Referring to FIG. 5, the traversal of the finite state machine is from the state S0, a reset state, to state S1, an input state, to state S3, the output state.

Figure 6:
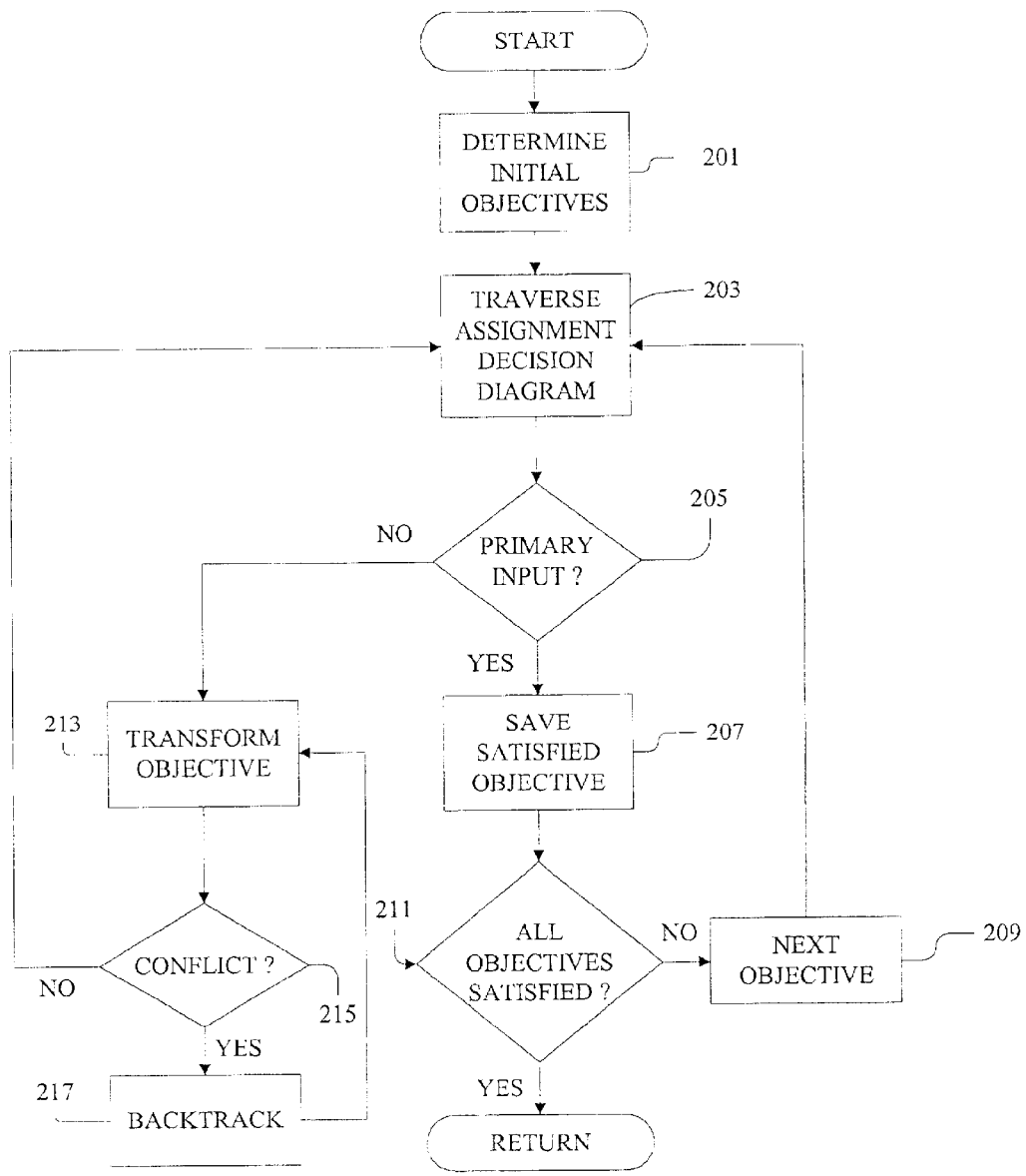
FIG. 6 illustrates a flow diagram of one embodiment of a sub-process performing justification and propagation search of an internal portion of an assignment decision diagram.

FIG. 6 illustrates a flow diagram of one embodiment of the sub-process performing the justification and propagation search of an internal portion of the assignment decision diagram. In block 201, initial objectives are established for the targeted internal portion, e.g., the addition operation node. For example, for the addition operation node 63, initial objectives are the observability of the output of the addition operation and the general controllability of the two inputs to the addition operation. The CS objective, controllability to a state, is also included since the addition operation executes in state S1. In block 203, the sub-process propagates the first objective through the assignment decision diagram based on the functionality of the RTL modules as described by the ADD. In block 205, the sub-process determines if a primary input has been reached. If in block 205, the sub-process determines that a primary input has been reached, the objective is considered to be satisfied and thus stored in a table representing the test environment for the internal portion of the ADD targeted. In block 211, the sub-process determines if all of the objectives have been satisfied and if the sub-process determines that all of the objectives have been satisfied, the sub-process returns. If the sub-process determines that more objectives remain that need to be satisfied then in block 209, the sub-process retrieves the next objective and in block 203 propagates the new objective.

If, in block 205, the sub-process determines that a primary input has not been reached, then the sub-process transforms the objective in block 213. In one embodiment, the objective is transformed based on predetermined records in a look-up table. Also, as required, time frames of the objectives are incremented or decremented. In block 215, the sub-process determines if the new objective or objectives conflict with other objectives, e.g., objectives already satisfied. If the sub-process determines that the new objectives do not conflict with other objectives, the sub-process repeats by traversing the ADD using the new objectives in block 203. However, if, in block 215, the sub-process determines that a conflict exists, the sub-process in block 217 backtracks. As such, if the search fails in one direction, the search backtracks, i.e., abandons an intermediate decision and continues in a new direction. In one embodiment, a backtrack limit and/or a time limit on each search is established. The process then repeats continuing to block 213 to generate new objectives and determining if the new objectives again conflict other objectives, in block 215. The propagation objectives are similarly determined and satisfied by the sub-process however in block 205 instead of primary inputs, primary outputs is the condition used to determine if the objective is satisfied.

Figure 7:
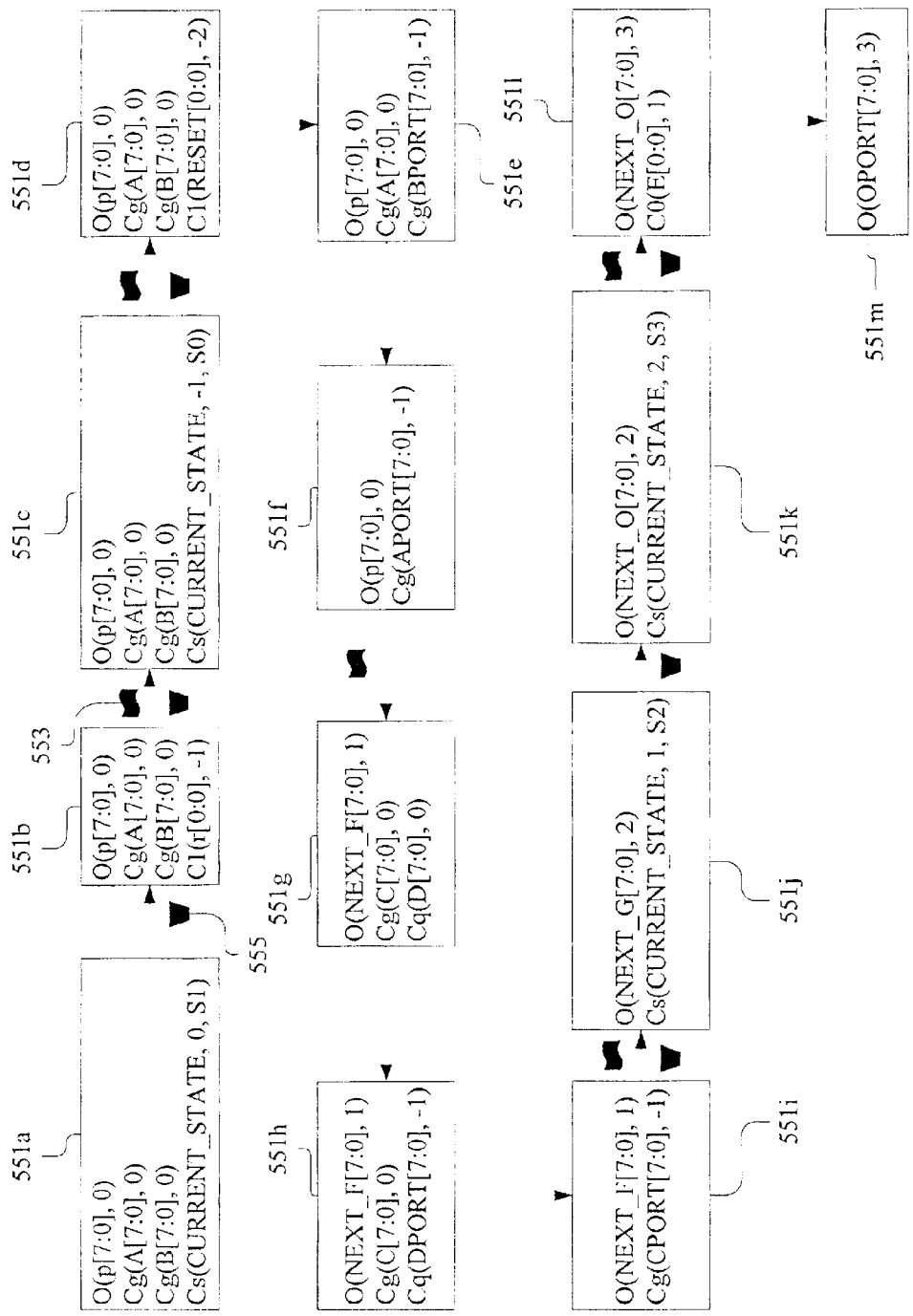
FIG. 7 illustrates a block diagram of one embodiment of objectives stored and manipulated in the sub-process as shown in FIG. 5.

FIG. 7 illustrates a block diagram of objectives stored and manipulated in the justification and propagation search sub-process as described in reference to FIG. 6 for testing of the arithmetic module. The initial objectives are put in a stack 551. According to the functionality of the RTL modules, the objectives are transformed from the top of the stack. As indicated by mark 553, some intermediate steps while traversing through the control logic is not shown, for readability since the number of intermediate steps may be numerous. Marking 553 indicates a multiple choice since that one or more choices for transformation and backtracking may be required at the indicated point. For justification, the state sequence is determined as illustrated in the first row of stacks containing shifting objectives and objectives that are satisfied. The justification paths from the operation inputs to the addition operation to the primary inputs are determined as shown in stacks 551E–F. Propagation paths conforming to the state transition graph as shown in FIG. 5 is also determined as shown in stacks 551G–M.

Referring now to FIGS. 4–7, the traversal of the assignment decision diagram to solve the justification objectives is described in greater detail below. As the assignment decision diagram is traversed if a read node is reached and the read node is not a primary input or an input to the process, i.e., current state, the objective is shifted to a corresponding write node. For example, the general controllability objective of variable B, read node B, is shifted to the corresponding write node, NEXT_B. However, if a read node is reached and the read node is a primary input, the objective is satisfied. Also, if the read node reached is a process input, the objective is shifted to a write node of another process or concurrent RTL statement which feeds the current process.

Alternatively, if a write node is reached, the corresponding objective is shifted to one of the assignment value inputs of the assignment decision node that feeds or supplies the reached write node, and the controllability to one objective is required for the corresponding condition input to the assignment decision node. The number of choices of justification paths are based on the number of inputs supplying the assignment decision node. As such, backtracking may be required, as shown in stacks 551A–B.

If there is a clock-edged testing expression subtree, i.e., subtree 331, with weight or event statements in the expression subtree that feeds the condition input to the assignment decision node, then the time frame number of the objective is decremented by one, as shown in stack 551B and 551D. If an output of an operation node, i.e., output 51 (FIG. 3), is reached, the output is transformed according to the functionality of the operation and the RTL algebra. Transformations for different RTL and logic operations are stored in a lookup table. Determining propagation paths is similar to determining justification paths as described above, but in the reverse, reversing from the primary outputs to the operation outputs. Also, during the propagation from a control input of an assignment decision node to the output of the assignment decision node, the corresponding assignment value input and complimentary condition value input of the assignment decision node, must have different values.

Newly assigned objectives may conflict with objectives that have been previously satisfied. For example, if general controllability is required on a variable in a particular time frame when the general controllability of the same variable in the same time frame has already been determined, a conflict may arise such that controlling a variable to two different arbitrary values in the same time frame is not possible. Likewise, controllability to zero of a variable can conflict with controllability to one for the same variable. Thus, a list of objectives that have been satisfied is maintained and consulted such that new objectives which conflict are not entered into the stack.

During the justification and propagation, the time frame number starts at zero on the initial objectives and decrements, i.e., become more negative during justification, and increments, i.e., become more positive during propagation. During the justification and propagation, a justification frontier is maintained in a stack with the objectives that need to be satisfied. The justification frontier is a set of objectives that represent a set of gates whose output value is known, but not implied by its input values. Also, during propagation an O-frontier is maintained. The O-frontier is a set of objectives that represents a set of gates having an output value that is arbitrary but has one or more error values at the inputs to the gates.

Figure 8:
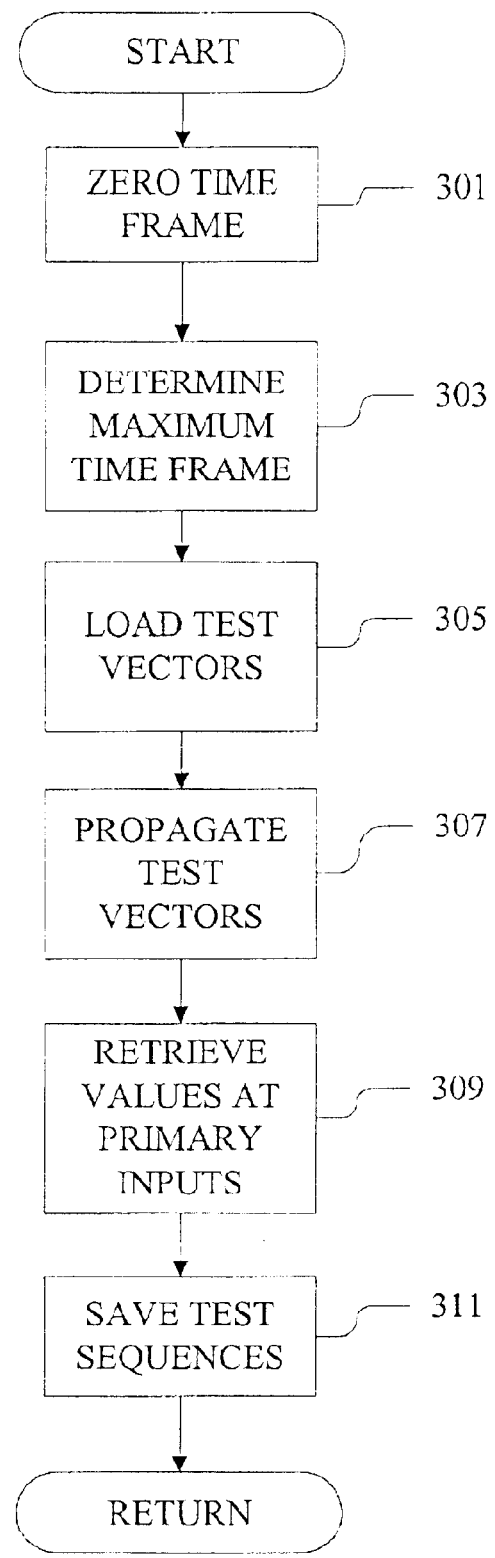
FIG. 8 illustrates a flow diagram of one embodiment of the sub-process testing the test environment found.

Once the set of justification and propagation paths are determined for the targeted internal portion, e.g., the addition operation, a test environment for the addition operation is found. FIG. 8 illustrates a flow diagram of one embodiment the sub-process of using the test environment to generate system level tests. In block 301, the sub-process zeros the most negative time frame of the objective in the justification/propagation record found in the justification/propagation sub-process. The sub-process also updates the other time frames in the other records. For example, the most negative time frame, negative two, is set to zero and the other time frame numbers are respectively updated, e.g., negative one to one, zero to two, one to three, etc. In block 303, the sub-process sets a maximum time frame, i.e., the largest time frame value of the updated time frames, in block 301. A pre-computed test set for the addition operation is then used by the sub-process to apply test vectors to the test environment in block 305. For example, for the addition operation, if the values of zero and five are respectively required in the left and right inputs of the addition operation as a test vector, read node A is assigned a zero, and read node B is assigned to five. The test environment is then used to justify the values to the primary inputs to get zero at the primary input APORT and five at the primary input BPORT. Primary inputs which are not used are supplied with random values.

The sub-process, in block 307, propagates the test vectors according to the objectives in the justification/propagation records for the specified time frame. The sub-process, in block 309, retrieves the values at the primary inputs and saves the test sequence in block 311. Primary inputs that are not used are assigned random values. The sub-process then returns. The sub-process is repeated as many times as required for any number of test vectors. All test sequences obtained from the test vectors of the pre-computed test set are concatenated together to generate a system level test set for the addition operation. The length of a test sequence corresponds to the largest time frame number in the test environment.

In one embodiment, the pre-computed test set for each type of arithmetic operation is stored in a library for each possible byte width. The pre-computed test set, in one embodiment, is determined from a test set for a serial implementation of the arithmetic operation in combination with a test set for a parallel implementation for the same operation. In one embodiment, if available, implementation independent test sets are used instead of the pre-computed test sets or a combination of the two.

Referring back to FIG. 1, once the arithmetic modules have been targeted and tested, the process targets logic arrays. Logic arrays are similarly tested as arithmetic modules, previously described. However, when a multi-byte logic operation or logic arrays are targeted and tested, the process recognizes that test sets always fall within a constant. As such, each test vector can be individually justified and propagated without using the general controllability objective. For example, for an OR gate array with left and right input buses, the test environment is {(Ca1, C0), (C0, Ca1), (C0, C0)}.

Figure 9:
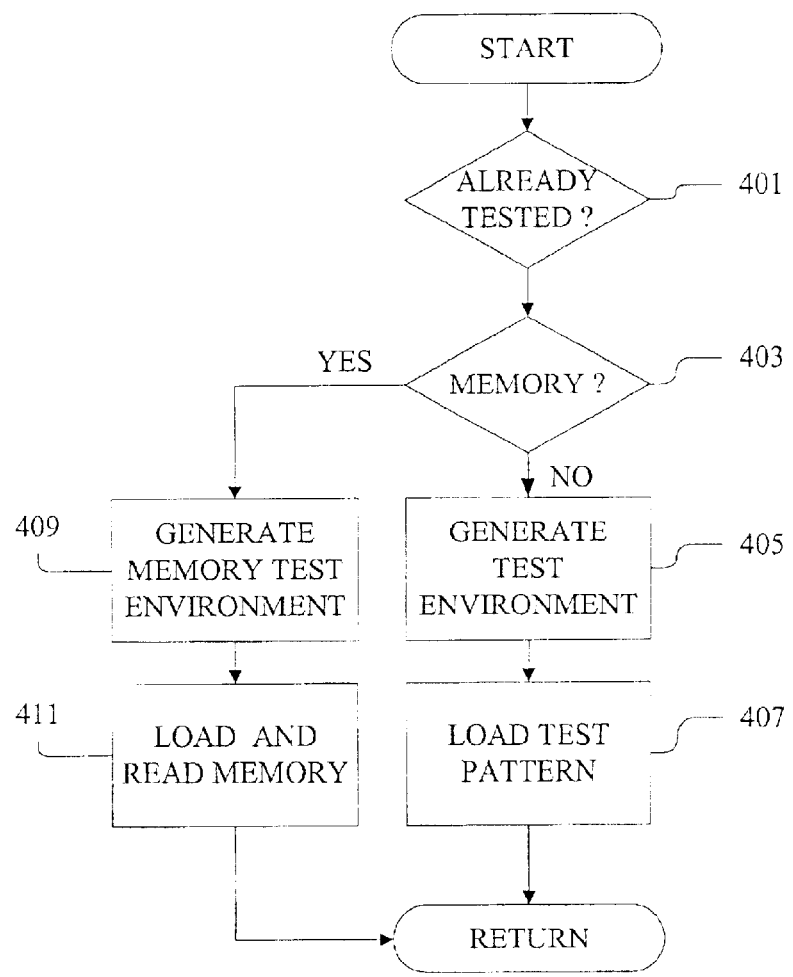
FIG. 9 illustrates a flow diagram of one embodiment of the sub-process of testing storage elements identified in a digital circuit.

Storage elements being registers, latches and memories are also targeted and tested by the process. FIG. 9 illustrates a flow diagram of one embodiment of the sub-process of testing storage elements. In block 401, the sub-process determines if the storage element has already been tested. In one embodiment, the sub-process compares the current storage element targeted to a list of previously tested modules to determine if the storage element has been already tested. If the storage element has already been tested, the sub-process returns. During the testing of arithmetic and logical modules, many of the registers and latches were tested. Thus, these corresponding latches and registers are not re-tested.

In one embodiment, each write node, read node and assignment decision node value port is tagged, e.g., marked with a "1", if during the determining of the test environment of the other internal portions, e.g., arithmetic modules, a Cg objective is satisfied for the variable of the write node, read node or assignment decision node value port. Thus, if the process determines that a write node, read node or assignment decision node value port is tagged, the process skips testing of the node or port.

If the sub-process determines, in block 401, that the storage element has not been tested then, in block 403, the sub-process determines if the storage element is a memory unit. Storage elements, as viewed from the assignment decision diagram, are write nodes coupled to outputs of an assignment decision node. If one of the condition inputs to the assignment decision node is coupled to a clock-edged testing subtree, then the storage element is implemented as a register, otherwise the storage element is implemented as a latch. Memories are typically formed by array declarations in the RTL circuit description.

If the sub-process determines that the storage element is not a memory unit, the sub-process generates a test environment for the storage element in block 405 and loads a pre-determined test pattern as a test vector to test the storage element, in block 407. The sub-process then returns. For instance, all untested storage elements are tested by loading zero patterns and one patterns to each of the elements and their outputs are observed. As such, one test environment is obtained with the controllability to zero objective and a separate test environment is obtained with the objective of controllability to all ones.

If the sub-process determines that the storage element is a memory unit, the sub-process generates a test environment for the memory unit, in block 409. In one embodiment, a test environment is found by using the general controllability objective at the data and address lines or variables to the memory along with a controllability to one objective on the right control port or a controllability to zero objective if the control port is low active. Subsequently, another test environment is found using a general controllability objective at the address variable of the memory and a controllability to one objective (controllability to zero if low active) on the read control port and a observability objective on the output port of the memory. In block 411, the sub-process tests the test environment of the memory unit by loading a test pattern into the memory and reading out the pattern. The sub-process then returns. The sub-process is repeated for each storage element targeted.

The process targets and tests the interconnects as shown in FIG. 1. Interconnects in a circuit is in the form of either buses or multiplexers. For example, a two-input multiplexer is represented as a assignment decision node with a two-assignment by inputs and complimentary condition input. In this example, the assignment value inputs to the assignment decision node are V1 and V2, and the condition input is S such that S assumes the value of one, the input V1 is chosen, and if S assumes the value of zero, the value input V2 is chosen. Thus, four test environments, {[Ca1(V1), C1(S)], [Ca1(V2), C0(S)], [C0(V1), Ca1(V2), C1(S)] and [Ca1(V1), C0(V2), C0(S)]} are required for a complete testability of the multiplexer. In case of a register, the register load is typically represented as a two-input assignment decision node on top of a write node representing the register variable. As such, testing the assignment decision node also tests the register load line.

For testing complex multi-input ADN nodes, a test environment is found using the Ca1 requirement on each of the value inputs to the ADN node and a C1 requirement on the corresponding condition input. For example, for a complex multi-input ADN node with five condition inputs S1, S2, S3, S4 and S5 and value inputs V1, V2, V3, V4 and V5, the test environment is found using the following objectives: {[Ca1(V1), C1(S1)], [Ca1(V2), C1(S2)], [Ca1(V3), C1(S3)], [Ca1(V4), C1(S4)], [Ca1(V5), C1(S5)]}. In one embodiment, the ADN is synthesized into a multi-input multiplexer tree. Since the order of the inputs to the multiplexer tree may be unknown, a select line stuck-at test may only be performed under the conditions of C0 at one of the value inputs, e.g., C0(V1), and C1 at the corresponding condition input, e.g., C1(s1). Accordingly, in this case, using the 5-input ADN node example above, the following objectives are also used to find the test environment: {[C0(V1), C1(S1)], [C0(V2), C1(S2)], [C0(V3), C1(S3)], [C0(V4), C1(S4)], [C0(V5), C1(S5)]}.

Random logic blocks are also targeted and tested by the process. The random logic blocks are represented as logic controlling the condition ports to the assignment decision nodes or if a value inputs to an assignment decision node, and the assignment decision nodes are constant, then the assignment decision nodes will be synthesized as a random logic block. The random logic assignment decision nodes thus are identified and tested by controlling each condition input signal to the assignment decision nodes to one and serving the write node of the output of the assignment decision node.

In one embodiment, the RTL circuit being tested includes components which are designated as black boxes, e.g., components whose RTL design are not public. As such, the process is unable to determine justification and propagation paths that extend past the boundaries of the black boxes without being provided addition information. The additional information required includes a description identifying how each input to the black box is propagated to one or more outputs within a fixed number of cycles. As such, the O-frontier maintained by the process may be propagated across the black box using this additional information. In one embodiment, additional information required includes how each output of the black box may be justified from one input or a combination of inputs in a fixed number of cycles. However, it is known that the black box is combinational in nature and a test bench is available, the process can test the black box as a arithmetic operation by finding a test environment using general controllability objectives at the inputs of the box and observability at the outputs of the box. If the black box is sequential in nature, then justification and propagation of test vectors may require numerous cycles, and as such additional design for testability devices or techniques may be required.

Figure 10:
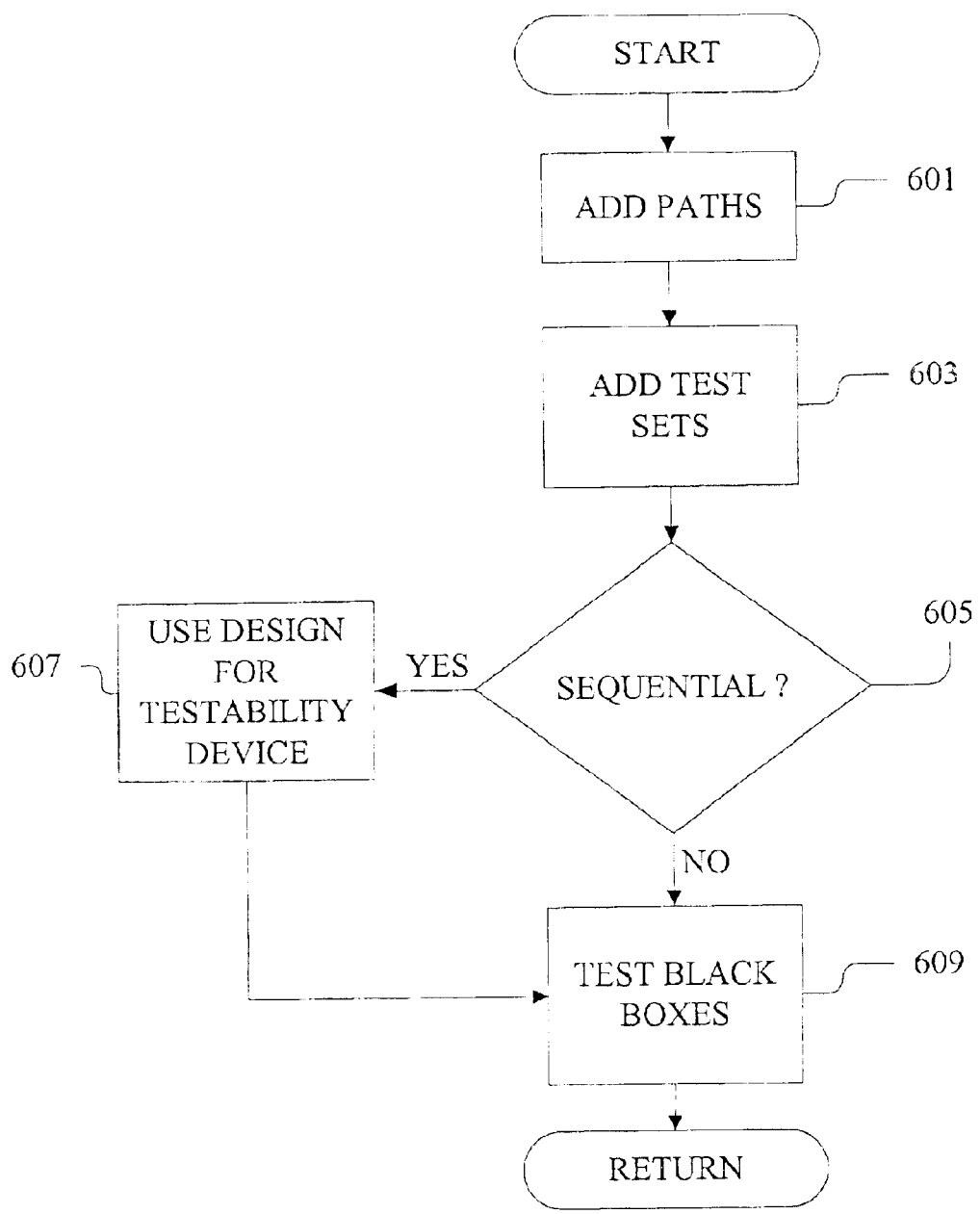
FIG. 10 illustrates a flow diagram of one embodiment of the sub-process of testing black boxes identified in a digital circuit.

Referring to FIG. 10, one embodiment of the sub-process testing black boxes targeted is shown. In block 601, the sub-process adds predetermined justification and propagation paths to the look-up table utilized for transformations. In block 603, the sub-process adds predetermined test sets to the test set library. In block 605, the sub-process determines if the black boxes are sequential. If the sub-process determines that the black boxes are sequential, then a design for test (DFT) device is utilized, in block 607, to manipulate clocks provided to the internal portion during justification and propagation of a test vector from the primary inputs to the inputs of the internal portion and to the primary outputs from the outputs of the internal portion. In block 609, the sub-process tests the black box using the predetermined justification and propagation paths and test sets, and then the sub-process returns.

As each internal portion of the assignment decision diagram is targeted and tested by the process, as described in reference to FIG. 1, other conditions also arise. For example, In one embodiment, the process encounters bus splits and/or joins in which the process uses various transformation rules based on the RTL algebra to handle these buses.

In other words, as the process traverses the ADD during justification and propagation, the process identifies split and join nodes and performs the appropriate transformation. For example, during justification, if two bit lines join to form a bus b[1:0], the objectives C1(b[0:0]) and C1(b[1:1]) transforms to Ca1(b[1:0]). Similarly, during propagation, if a bus a[3:0], for example, splits into four individual bit lines, the objective O(a[3:0]) is transformed to [O(a[0:0]) & O(a[1:1]) & O(a[2:2]) & O(a[3:3])]. In another example, if a bus b[5:2] splits into individual bit lines, during propagation, the objective O(b[5:2]) transforms to [O(b[5:5]) & O(b[4:4]) & O(b[3:3]) & O(b[2:2])]. Table 1 describes further examples of transformations of objectives when, during justification, one or more bit lines join (rows one and two) and, during propagation, one or more bit lines join (rows three and four).

TABLE 1

| Case | Initial Objective(s) | New Objective(s) |
|---|---|---|
| 1 | Ca1(a[7:4]), Ca1(a[3:2]), Ca1(a[1:0]) | Ca1(a[7:0]) |
| 2 | Cq(d[3:2]), Cq(d[1:0]) | Cq(d[3:0]) |
| 3 | C1(c[3:2]), C0(c[1:1]), C0(c[0:0]) | Cg(c[3:0]) |
| 4 | O'(e[8:8]), O(e[7:6]), O(e[5:4]), O'(e[3:3]) | O(e[8:3]) |

In some instances, a bus objective, as a whole, fails to propagate or justify, as such the objectives are expanded in terms of bit-level objectives, e.g., expanding a Cg objective to a random set of C1 and C0 objectives, and then justified and propagated.

In another example, a register having an asynchronous set/reset is encountered. To represent the asynchronous set/reset in the assignment decision diagram, the write node corresponding to the variable stored in the register is fed by an assignment decision node which has one condition input that does not have the clock tree expression in its transitive fan-in. During propagation and justification, if the assignment value input to the assignment decision node selected corresponds to the condition input, then the time frame is unchanged, e.g., not incremented or decremented. Thus, the asynchronous behavior is maintained.

In one embodiment, if the process determines that justification of a variable depends on the same variable in the previous time frame in a repetitive manner and other possibilities for justification have been exhausted, the process determines that a counter variable is detected. For example, if the justification objectives have a patter of Cg(a[3:0], 0), Cg(a[3:0], −2), Cg(a[3:0], −4), the process identifies the variable a[3:0] as a counter variable. Once the process identifies the counter variable, the process locates the reset line of the counter variable, resets the counter and exercises the counter for a fixed number of cycles to propagate the counter's output to a primary output.

In one embodiment, the RTL circuit is hierarchical in nature. The process handles the hierarchical design using top level connectivity files that specify the connectivity among the different components. During justification, when the justification frontier has reached the inputs of a component, the connectivity is used to transfer the justification frontier to the output of another leaf component or to a primary input. As such, testing occurs in all leaf components of the RTL circuit. During propagation, the process similarly operates to reach a primary output. To assist in the hierarchy traversal, objectives are tagged with a hierarchy string. For example, general controllability of a variable A, Cg (A), where A is in component X which is in component Y which is in component Z, then Cg (A) is tagged with hierarchy string X.Y.Z.

In one embodiment, the process is unable to find the test environment and thus heuristics are used. In one embodiment, the heuristic partial justification and propagation is used. As such, a partial test environment is found based on the satisfying of some justification and propagation objectives that were required. The partial test environment is then used to generate a test sequence.

If a propagation objective fails to be satisfied, a propagation heuristic is used in which a predetermined number of random test vectors are added to a partial test environment based on justification and thus attempt to propagate the error to a primary output.

Accordingly, the present invention provides a test pattern generation process and system for RTL circuits. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive. The scope of the invention to be determined by the appended claims and their equivalence rather than the foregoing description.

What is claimed is:

1. A method for generating test patterns for testing a register transfer level digital circuit, the method comprising:
generating an assignment decision diagram of the register transfer level digital circuit;
identifying modules in the assignment decision diagram;
determining objectives for the identified modules using a nine-valued symbolic algebra;
justifying and propagating the objectives by traversing the assignment decision diagram to obtain a test environment; and
applying predetermined test vectors through the register transfer level digital circuit using the test environment obtained.

2. The method of claim 1 wherein generating of the assignment decision diagram comprises receiving a hardware description language representation of the register transfer level digital circuit and converting the hardware description language representation of the register transfer level digital circuit into the assignment decision diagram.

3. The method of claim 1 wherein the assignment decision diagram comprises a graph-like structure representing functional behavior of the register transfer level digital circuit and an approximate structural representation of the register transfer level digital circuit.

4. The method of claim 1 wherein the identified modules comprise arithmetic operations, logic arrays, random logic blocks, storage elements, interconnects and black boxes.

5. The method of claim 1 wherein the objectives comprises symbolic variables representing values at inputs and outputs of the register transfer level digital circuit and the identified module and a frame cycle.

6. The method of claim 5 wherein the objectives further comprises symbolic variables representing values at inputs and outputs of the register transfer level digital circuit and the identified module, a frame cycle and a state.

7. The method of claim 1 wherein the algebra comprises symbolic variables representing the ability of a value to be controlled to one of a value and a state.

8. The method of claim 7 wherein the algebra comprises symbolic variables representing the ability of a value to be observed.

9. The method of claim 1 wherein the algebra comprises symbolic variables comprising controllability to one, controllability to zero, controllability to all ones, controllability to a constant, controllability to a state, controllability to an arbitrary value, controllability to a high impedance state, observeability of a fault, and complement observeablity of a fault.

10. The method of claim 1 wherein justifying and propagating objectives comprises justifying test vectors to inputs of the identified modules from primary inputs of the digital circuit and propagating test responses from the outputs of the identified modules to primary outputs of the register transfer level digital circuit.

11. The method of claim 1 wherein justifying and propagating objectives comprises a branch and bound search procedure having a backtracking and a time limit.

12. The method of claim 1 wherein the test environment comprises a set of justification and propagation paths from primary inputs to primary outputs of the identified modules which exercises the module when test vectors are applied at the primary inputs.

13. The method of claim 12 wherein the justification and propagation paths span many clock cycles.

14. The method of claim 1 further comprising utilizing heuristics to obtain the test environment.

15. The method of claim 1 further comprising continuing to identify modules, determine objectives, justify and propagate objectives and apply predetermined test vectors for each of the modules identified and for each test environment obtained to obtain system-level test sets for each of the module identified.

16. The method of claim 15 further comprising concatenating system-level test sets for each of the modules identified to obtain a complete test set for the register transfer level digital circuit.

17. The method of claim 15 wherein the test vectors are obtained from a test set library.

18. The method of claim 1 wherein the test vectors are obtained from a test set library.

19. A method of generating test patterns for testing a register transfer level digital circuit, the method comprising:
receiving a functional register transfer level circuit design of the digital circuit having a single clock line;
generating a data structure from the circuit design received;
identifying logic structures and blocks from the data structure generated;

justifying test objectives from inputs of the logic structures and blocks to primary inputs of the register transfer level digital circuit to identify justification paths;

propagating test objectives from outputs of the logic structures and blocks to primary outputs of the register transfer level digital circuit to identify propagation paths; and applying predetermined test vectors through the digital circuit using the justification and propagation paths identified.

20. The method of claim 19 wherein generating the data structure comprises representing the register transfer level circuit design using a hardware description language representation and converting the hardware description language representation into an assignment decision diagram.

21. The method of claim 20 wherein the assignment decision diagram comprises a graph-like structure representing functional behavior of the register transfer level digital circuit and an approximate structural representation of the register transfer level digital circuit.

22. The method of claim 19 wherein the identified logic structures and blocks comprise arithmetic operations, logic arrays, random logic blocks, storage elements, interconnects and black boxes.

23. The method of claim 19 wherein justifying test objectives and propagating test objectives comprises using objectives determined by a nine-valued algebra.

24. The method of claim 23 wherein the objectives comprises symbolic variables representing values at inputs and outputs of the register transfer level digital circuit and the identified logic structures and blocks and a frame cycle.

25. The method of claim 23 wherein the objectives further comprises symbolic variables representing values at inputs and outputs of the register transfer level digital circuit and the identified logic structures and blocks, a frame cycle and a state.

26. The method of claim 23 wherein the algebra comprises symbolic variables representing the ability of a value to be controlled to one of a value and a state.

27. The method of claim 26 wherein the algebra comprises symbolic variables representing the ability of a value to be observed.

28. The method of claim 23 wherein the algebra comprises nine symbolic variables comprising controllability to one, controllability to zero, controllability to all ones, controllability to a constant, controllability to a state, controllability to an arbitrary value, controllability to a high impedance state, observeability of a fault, and complement observeablity of a fault.

29. The method of claim 19 further comprising utilizing heuristics to identify justification and propagation paths.

30. The method of claim 19 further comprising continuing to identify logic structures and blocks, justify test objectives, propagate test objectives and apply predetermined test vectors for each of the logic structures and blocks identified for each of the justification and propagation paths identified to obtain system-level tests set for each of the logic structures and blocks identified.

31. The method of claim 30 further comprising concatenating system-level test sets for each of the logic structures and blocks identified to obtain a complete test set for the register transfer level digital circuit.

* * * * *